(12) United States Patent
Kieft et al.

(10) Patent No.: US 11,328,892 B2
(45) Date of Patent: May 10, 2022

(54) COATING ON DIELECTRIC INSERT OF A RESONANT RF CAVITY

(71) Applicant: FEI Company, Hillsboro, OR (US)

(72) Inventors: Erik Rene Kieft, Eindhoven (NL); Pleun Dona, Eindhoven (NL); Jasper Frans Mathijs van Rens, Eindhoven (NL); Wouter Verhoeven, Eindhoven (NL); Peter Mutsaers, Eindhoven (NL); Jom Luiten, Eindhoven (NL); Ondřej Bačo, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/987,172

(22) Filed: Aug. 6, 2020

(65) Prior Publication Data

US 2021/0043410 A1 Feb. 11, 2021

Related U.S. Application Data

(60) Provisional application No. 62/884,874, filed on Aug. 9, 2019.

(51) Int. Cl.
*H01J 37/04* (2006.01)
*H01J 37/26* (2006.01)
*H01P 7/06* (2006.01)

(52) U.S. Cl.
CPC .......... *H01J 37/045* (2013.01); *H01J 37/26* (2013.01); *H01P 7/06* (2013.01); *H01J 2237/043* (2013.01)

(58) Field of Classification Search
CPC .......... H01J 37/04; H01J 37/045; H01J 37/26; H01J 2237/043; H01J 2237/0432; H01P 7/06
See application file for complete search history.

(56) References Cited

U.S. PATENT DOCUMENTS

| 5,245,249 A | * | 9/1993 | Sakurai | .................. H01J 31/126 313/313 |
| 2002/0096684 A1 | | 7/2002 | Brandes et al. | |

(Continued)

FOREIGN PATENT DOCUMENTS

CN 103840240 A 6/2014

OTHER PUBLICATIONS

EP20189362.5, Partial European Search Report, dated Mar. 15, 2021, 11 pages.

(Continued)

*Primary Examiner* — David E Smith

(57) ABSTRACT

Disclosed herein are radio frequency (RF) cavities and systems including such RF cavities. The RF cavities are characterized as having an insert with at least one sidewall coated with a material to prevent charge build up without affecting RF input power and that is heat and vacuum compatible. One example RF cavity includes a dielectric insert, the dielectric insert having an opening extending from one side of the dielectric insert to another to form a via, and a coating layer disposed on an inner surface of the dielectric insert, the inner surface facing the via, wherein the coating layer has a thickness and a resistivity, the thickness less than a thickness threshold, and the resistivity greater than a resistivity threshold, wherein the thickness and resistivity thresholds are based partly on operating parameters of the RF cavity.

13 Claims, 4 Drawing Sheets

(56) References Cited

U.S. PATENT DOCUMENTS

| | | | |
|---|---|---|---|
| 2014/0049118 A1* | 2/2014 | Karalis | H01F 38/14 |
| | | | 307/104 |
| 2014/0103225 A1* | 4/2014 | Kieft | H01J 37/28 |
| | | | 250/440.11 |
| 2018/0151326 A1 | 5/2018 | Kieft | |

OTHER PUBLICATIONS

Verhoeven W et al., "High quality ultrafast transmission electron microscopy using resonant microwave cavities", arxiv.org, Cornell University Library, 201 Olin Library Cornell University Ithaca, NY 14853, Sep. 7, 2017 (Sep. 7, 2017), XP080819184, 5 pages.

* cited by examiner

COATING ON DIELECTRIC INSERT OF A RESONANT RF CAVITY

The present application claims the priority benefit of U.S. Provisional Patent Application Ser. No. 62/884,874, filed Aug. 9, 2019. The disclosures of the foregoing application are incorporated herein by reference.

FIELD OF THE INVENTION

This application is generally directed toward radio frequency cavities, and more specifically to coating layers in radio frequency cavities.

BACKGROUND OF THE INVENTION

Charged particle microscopes typically provide a continuous charged particle beam for an energized emitter. While a continuous beam works fine in most applications, a time-varying beam would be beneficial in other applications, such as time-dependent measurements where the sample is being excited while being imaged. Time-varying charged particle beams, however, are more difficult to generate. One known method is to use an optically-pumped emitter that emits charged particles only when optical energy is radiating the source. While this technique is typically only used in a pulsed mode, continuous charged particle beams are possible but come with unwanted drawbacks in operation. Although a dedicated pulsed system is useful in some applications, it is desirable to have a charged particle microscope that can provide both pulsed and continuous charged particle beams.

SUMMARY

Disclosed herein are radio frequency (RF) cavities and systems including such RF cavities. The RF cavities are characterized as having an insert with at least one sidewall coated with a material to prevent charge build up without affecting RF input power and that is heat and vacuum compatible. One example RF cavity includes a dielectric insert, the dielectric insert having an opening extending from one side of the dielectric insert to another to form a via, and a coating layer disposed on an inner surface of the dielectric insert, the inner surface facing the via, wherein the coating layer has a thickness and a resistivity, the thickness less than a thickness threshold, and the resistivity greater than a resistivity threshold, wherein the thickness and resistivity thresholds are based partly on operating parameters of the RF cavity Another example apparatus includes an outer shell, the outer shell having an internal cavity with openings on a top and bottom of the internal cavity, an insert disposed within the internal cavity of the outer shell, the insert having a via extending all the way through and aligned with the openings on the top and bottom of the outer shell, and a coating layer disposed on a surface of the insert facing the via, the coating layer having a thickness less than a thickness threshold and a conductance less than a conductance threshold, wherein the coating layer prevents charge buildup on the insert.

An example system at least includes an emitter coupled to emit a beam of electrons along an optical path, one or more sets of optics arranged along the optical path; and an RF cavity encompassing a portion of the optical path, the RF cavity comprising, a dielectric insert, the dielectric insert having an opening extending from one side of the dielectric insert to another to form a via, and a coating layer disposed on an inner surface of the dielectric insert, the inner surface facing the via, wherein the coating layer has a thickness and a resistivity, the thickness less than a thickness threshold, and the resistivity greater than a resistivity threshold, wherein the thickness and resistivity thresholds are based partly on operating parameters of the RF cavity.

BRIEF DESCRIPTION OF THE DRAWINGS

Like reference numerals refer to corresponding parts throughout the several views of the drawings.

DETAILED DESCRIPTION OF EMBODIMENTS

Figure 1:
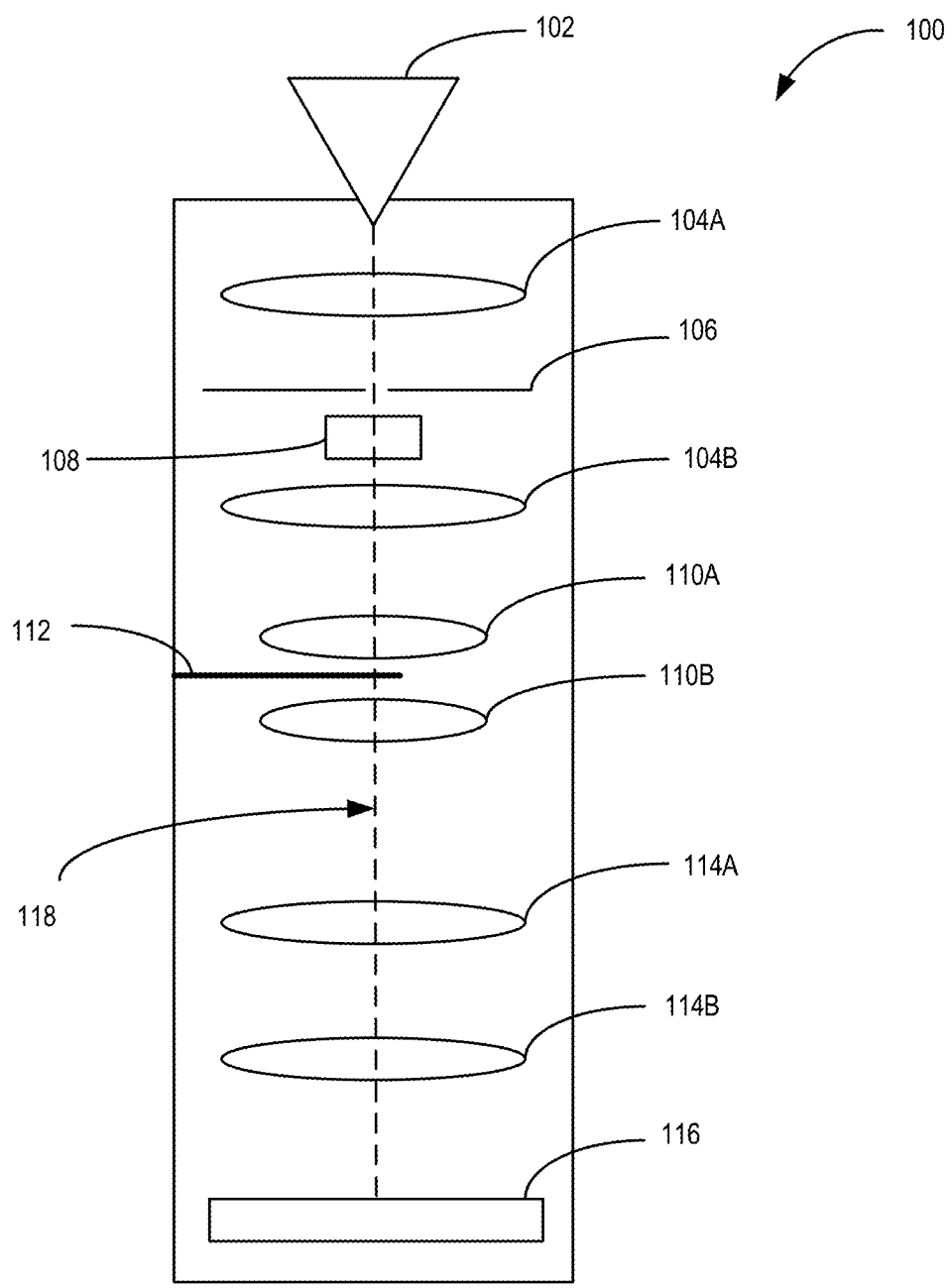
FIG. 1 is an example charged particle microscope in accordance with an embodiment of the present disclosure.

Embodiments of the present invention are described below in the context of a charged particle microscope where a radio frequency cavity is enabled to strobe a charged particle beam. For example, a radio frequency cavity is included in a transmission electron microscope so that an electron beam may be strobed so that a sample is illuminated with a train of electron beam pulses instead of a continuous electron beam. However, it should be understood that the methods described herein are generally applicable to a wide range of different charged particle microscopes.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatuses are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

One solution to the problem described above is to include a radio frequency (RF) cavity within a charged particle microscope. The RF cavity may be used to generate a pulsed charged particle beam through interaction of one or more RF standing waves and a passing charged particle beam. In some embodiments, the RF cavity may include an input and output aperture that allows the charged particle beam to internally traverse the RF cavity so that the charge particle beam interacts with the RF waves established within the cavity. In other embodiments, a "chopping aperture", which is where the pulses are created due to interaction of the RF standing waves and the charged particle beam at the aperture, is arranged away from the actual RF cavity. In either embodiment, however, the space and time interaction of the aperture, the RF standing wave(s) and the charged particle beam form the charged particle beam pulses. In such a technique, the RF waves will effectively move the charged particle beam across the output aperture so that a pulsed train of charged particles are generated, which are then directed toward a sample.

Previously, a dual-mode RF cavity as a beam chopper in a charged particle microscope has been described, such as in U.S. Pat. No. 9,048,060, which is incorporated herein for all purposes. As discussed in that reference, the RF cavity could include a dielectric insert, where the insert could be coated by a film of electrically conductive material for prevention or reduction of charge accumulation on the dielectric insert. While such an observation appears on its surface as straightforward, the implementation of such an idea required more effort than anticipated.

The additional effort stemmed from the realization that the coating material would need to meet very specific requirements. In general, the coating material needs to be sufficiently conductive to prevent the charge accumulation, but should not affect the resonance of the RF cavity nor should it generate substantial power loss. To prevent effects on the resonance of the RF cavity, the thickness of the coating layer should be thin enough that the RF power transmits through without causing much reflection and/or absorption and thin enough that the resonance of the RF cavity is not adversely affected. To meet such a requirement, it is desirable that the thickness of the coating layer be less than a skin depth, where the operating parameters of the RF cavity along with the resistance of the material determine the skin depth. While the thickness is desirably much thinner than the skin depth, the conductance/resistivity of the material will also affect the allowable thickness.

With regards to the power dissipation requirement, it is desirable that the coating material generate negligible power dissipation with respect to input RF power. For example, a maximum power dissipation equal to 10% of the input power is desired, but less power dissipation would be preferable. The power dissipation is determined by the coating material characteristics, thickness and operating parameters of the RF cavity as well. If the requirements are satisfied, then the quality factor of the RF cavity should be maintained.

While deciding on a material seems trivial, that turned out to not be the case. For example, conductive and semiconductive materials will stop the accumulation of charge, but their high conductivities result in extremely thin layers that are not manufacturable to the degree required for rough surfaces. For example, a copper layer would need to be much less than 1.2 µm (the skin depth at a 3 GHz frequency) to satisfy the thickness requirement. However, even if a 10 nm copper layer was manufacturable, the associated power dissipation, e.g., 50 kW, does not satisfy the power dissipation requirement. In such an example, the power dissipation of the copper layer may be all or most of the input power, which is highly undesirable. Semiconductor materials do not satisfy the requirements either even though they may allow for thicker layers at a lower power dissipation than copper.

In general, it has been determined that the coating layer needs to have a high resistance/low conductance that allows for a layer of a manufacturable thickness with minimal power loss at the RF cavity operating parameters. Additionally, it is desirable that the material withstand high temperature environments (up to 1000° C., for example), be homogenous/continuous in manufacturing, and compatible with high vacuum environments, e.g., no outgassing. One solution is amorphous silicon (a-Si), which has a resistance greater than 60 GΩ, allows for a thickness of up to 500 nm (and possibly thicker) while providing negligible power dissipation, microwatts of power dissipation for example. While other materials may also meet the requirements, such as silicon carbide and zinc oxide for example, the disclosure will focus on a-Si for illustration purposes.

FIG. 1 is an example charged particle microscope 100 in accordance with an embodiment of the present disclosure. The charged particle microscope (CPM) 100 includes a radio frequency (RF) cavity that a charged particle beam passes through for the intended purpose of dynamically strobing the charged particle beam to generate a stream of charged particle beam pulses for illuminating a sample. While strobing the charged particle beam is disclosed, the RF cavity may be disabled when desired so that a continuous charged particle beam is provided to a sample instead. In some embodiments, the CPM 100 is a transmission electron microscope (TEM), but the type of CPM is not limiting. In other embodiments, CPM 100 may be a scanning electron microscope (SEM), scanning transmission electron microscope (STEM), a dual beam microscope that includes both an SEM and a focused ion beam (FIB), or the like.

The simplified CPM 100 illustrated in FIG. 1 includes an emitter 102, one or more collimator lenses 104A and 104B, a beam defining aperture (BDA) 106, an RF cavity 108, an objective lens 110A and 110B, a sample holder 112, one or more projection lenses 114A and 114B, and a detector 116. One skilled in the art understands that additional or fewer components may be implemented in CPM 100 and the illustrated components are mere examples of what may typically be implemented in a TEM.

The emitter 102 provides a beam of charged particles 118 that is directed down the CPM 100 on an optical path that traverses the other components, ending on the detector 116. The collimator lenses 104A, B condition and focus the charged particle beam 118 onto a desired location/plane, such as the plane where the sample holder 112 is located. The objective lens 110A, B additionally focuses the charged particle beam 118 onto the sample holder location and further condition the charged particle beam 118 as it emerges from a sample. After the charged particle beam 118 emerges from a sample, e.g., after traversing a sample, the projection lenses 114A, B condition the emergent charged particle beam 118 for detection by detector 116. The detector 116 detects images of the sample based on the interaction of the charged particles of the charged particle beam 118 with the sample.

In general, the various lenses 104, 110 and 114 may be electrostatic, electromagnetic, or combinations thereof. Additionally, the emitter 102 may be any type of emitter, such as thermionic, cold field emission, and the like. In most embodiments, emitter 102 provides electrons, but ion emitters are also possible and within the bounds of the present disclosure. The detector 116 may be a direct electron detector or a micro-channel plate based detector as known in the art.

The RF cavity 108 includes a via extending all the way through the cavity so that the charged particle beam 118 can pass through and continue traversing the CPM 100 along the optical path. The RF cavity 108 may be any shape desired, such as round, oval, square, rectangular, and the like, that enables one or more standing waves, e.g., modes, to be established. In general, it is desirable that the dimensions of the RF cavity 108 be based on one or more desired operating frequencies so that a resonant cavity is established at the one or more desired operating frequencies. Depending on the number of modes desired to be established within the RF cavity 108, an associated number of emitter-antenna pairs will be included. The RF cavity 108 will include an outer chamber designed to establish the desired modes, and a dielectric insert. The dielectric insert (discussed in further detail below) will also include a via extending through it for passage of the charged particle beam 118. As such, the dielectric insert will be arranged inside the RF cavity 108 to encompass the charged particle beam optical axis.

The RF cavity 108, as noted, may be enabled to strobe the charged particle beam 118 so that a train of charged particle beam pulses emit from the RF cavity, where the pulse separation is determined by the operating frequency of the RF cavity 108, and the pulse width/duration is determined by a combination of the input power, quality factor and frequency of the RF cavity 108. Such an RF cavity is further described in U.S. Pat. No. 9,048,060 B2, which is owned by the current applicant, and which is incorporated herein for all purposes. Other than simply forming a strobed charged particle beam, the RF cavity 108 may be used in systems that include a streak camera that allows for time-resolved charged particle microscopy. In general, it is desirable that the RF cavity 108 does not build up charge on the dielectric insert due to the passing charged particle beam 118. The buildup of charge causes the passing charged particle beam 118 to drift out of alignment, which may reduce or stop the charged particle beam 118 from continuing along the optical path or exiting from the RF cavity 108.

To reduce or eliminate the buildup of charge on the dielectric insert, it is desirable to coat the insert, at least on sidewalls facing the via, with a conductive yet highly resistive material. It is desirable that this material be of a thickness that will not affect the resonance of the cavity, and further not dissipate substantial RF power. For example, the thickness may be less than a skin depth at the RF operating parameters and the power dissipation be minimal, e.g., 10% or less of RF input power. Further, it may also be desirable that the coating material be compatible with high vacuum environments (e.g., little to no outgassing) and resistant to high temperatures. In some embodiments, the desired thickness may be much less than the calculated skin depth, which may be a manufacturing concern if a continuous layer is desired. Given such requirements, a material that is vacuum compatible with a high resistance/low conductance is desirable. Conductive materials and semiconductors due not provide the desired results due to the determined thickness and power dissipation being either un-manufacturable and/or too high, respectively.

One solution, however, is amorphous silicon (a-Si). Amorphous silicon has a high resistance/low conductance, which allows for thicker, more manufacturable layers that have negligible power dissipation. Note, the skin depth has a square root relationship with resistivity ($\rho$) and the power dissipation has a linear relationship with conductance ($\sigma$), where $\sigma=1/\rho$. Additionally, a-Si meets the other requirements, such as high temperature compatible, high vacuum compatible, and thin, continuous, and homogenous layers are easily manufacturable using chemical vapor deposition, for example. As such, a coating layer formed from a-Si prevents the buildup of charge on the sidewalls of the insert and has a resistance/conductance characteristic that allows for relatively thick layers that generate minimal power dissipation.

Figure 2A:
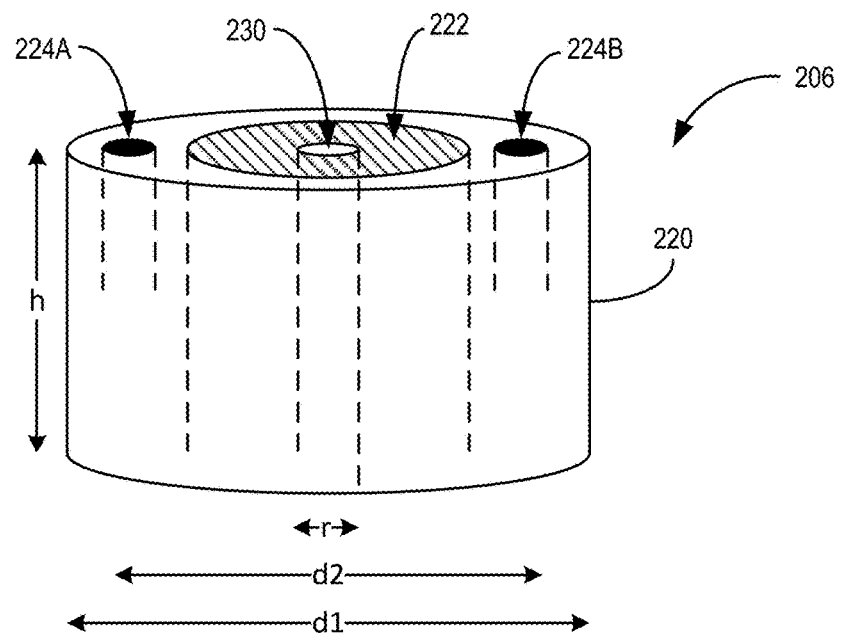
FIGS. 2A, 2B and 2C are example illustrations of an RF cavity in accordance with an embodiment of the present disclosure.
Figure 2B:
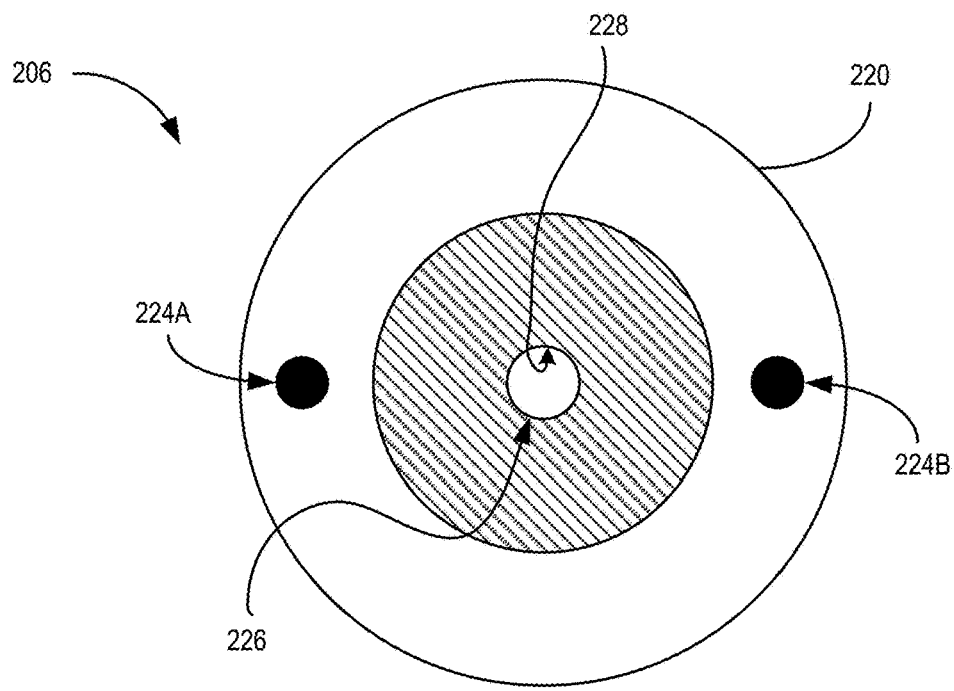
Figure 2C:
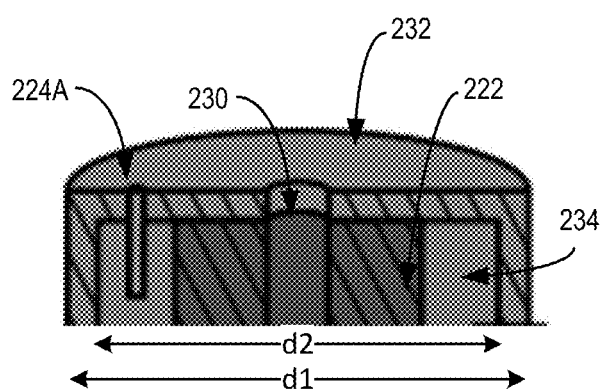

FIGS. 2A through 2C are example illustrations of RF cavity 206 in accordance with an embodiment of the present disclosure. The RF cavity 206 may be implemented in a CPM system, such as CPM 100, for deflecting a charged particle beam using one or more RF standing waves generated within the RF cavity 206. Deflecting the charged particle beam results in a pulsed charged particle beam as an output of the aperture that extends through the RF cavity 206. A pulsed charged particle beam may, for example, allow for time-resolved probing of a sample.

The RF cavity 206 includes an outer shell 220, an insert 222, one or more conductors 224A, 224B, and a coating layer 228. The outer shell 220 may be any desired shape, such as round, oval, square, and the like, and forms a cavity 234 of a similar geometry. Additionally, the outer shell 220 includes an opening 230 in a top surface 232 (and a bottom surface, not shown) that extends through the entire height and the cavity 234 of the outer shell 220. In the embodiment shown in FIG. 2A, the outer shell 220 has a height h and an inner diameter d1, where the opening/via has a diameter r. In some embodiments, the RF cavity 206 has a resonance that is determined, at least partially, by the inner diameter d2.

The insert 222 may be located at a center of the outer shell 220 and may have a height to fit within the cavity 234, and has a diameter d2 that is less than d1 of the outer shell 220. Additionally, the insert 222 also has an opening/via that extends through the height of the insert 222. In general, the via in the insert 222 aligns with the top and bottom openings in the outer shell 220 so that charged particle beam can pass through the RF cavity 206. The insert 222 may be formed from a dielectric, such as ZrTiO4, for example, but other dielectric materials are also implementable.

The one or more conductors 224 A, B, which may alternatively be referred to as antennae, may allow the formation of RF standing waves inside the RF cavity 206. the two or more conductors 224 A, B may be formed from any conductor, such as copper, silver, gold, platinum, etc., and are coupled to one or more RF power sources (not shown) for the generation of a desired standing wave. While the RF cavity 206 only shows one pair of antennae, in other embodiments, four conductors may be included for the formation of two standing waves. In such an embodiment, the second pair of antennae may be included so that the additional standing wave is at a right angle to the first standing wave.

The coating layer 228 may be at least formed on an inner surface 226 of the insert 222. In general, the coating layer 228 is included to reduce or prevent charge buildup on the insert 222 due to the passing charged particle beam. However, as noted above, it is desirable that the inclusion of the coating layer 228 not affect the resonance of the RF cavity 206 and that any RF power dissipation due to the coating layer 228 be minimal. To prevent changes of the resonance, the coating layer 228 may desirably be less than a skin depth. The skin depth determined based on the RF cavity operating parameters, such as 3 GHz operating frequency for example. With regards to the power dissipation, the power dissipation of the coating layer 228 may desirably be 10% or less of the input power. While various characteristics of the coating layer 228 material affect skin depth and power dissipation, at least one characteristic can affect both—conductance/resistivity of the selected material.

In terms of conductance/resistivity, the skin depth is dependent upon the square root of resistivity, whereas the power dissipation has a linear relationship with conductance. If conductance is the simple inverse of resistivity, then as the conductance decreases and the resistivity increases, the skin depth increases and the power dissipation decreases. This relationship is then used to determine a material to use for the coating layer 228. In some embodiments, the thickness should be less than a thickness threshold and the resistivity should be greater than a resistivity threshold (conductance less than a conductance threshold). These thresholds, as long as they are satisfied, ensure the requirements of the coating layer 228 are satisfied, i.e., the thickness and power dissipation requirements.

As noted, the two main characteristics desired of the coating layer 228 is a manufacturable skin depth and negligible/minimal power dissipation. Manufacturable implies that a continuous, homogenous and reproducible layer may be deposited on a surface that has a root-mean-square (rms) roughness on the order of 1 to 2 microns. Additionally, the desired thickness of the coating layer 228 is much less than the skin depth at the RF operating parameters, where much less refers to 10% or less of the calculated skin depth. The power dissipation is desired to be negligible with regards to input RF power, and refers to 10% or less of the input power. In terms of thresholds, the thickness threshold is at most the skin depth, but could be less than a skin depth, and the resistivity/conductance thresholds may be based on either a multiplier of conductance and the thickness threshold or determined based on 10% of the input RF power. For example, If you take 10 nm as the smallest viable coating thickness for manufacturing reasons, then the material for the coating layer 228 would need to have a resistivity $\rho > 5 \times 10^{-2} \Omega cm$ (but preferably much higher). In general terms, the conductance/resistivity thresholds may be determined based on back calculating a thickness for a given geometry and at 10% of the input power, while the thickness threshold is based on the skin depth.

Additionally, the material for the coating layer 228 is desired to meet other requirements, such as resistance to high temperatures and be vacuum compatible. To satisfy the temperature resistance requirement, the material should not change, melt, or sublimate at high temperatures, 600 to 1000° C. for example. And to satisfy the vacuum compatible requirement, the material should not outgas under high vacuum.

One material that meets all of the above requirements is amorphous silicon. Amorphous silicon has been found to be highly resistive, greater than 60 G$\Omega$ ($\rho > 5 \times 10^3$ $\Omega \cdot m$). At this resistance/conductivity, the skin depth is 0.65 µm, which allows for a layer thickness of up to 500 nm. A layer of 500 nm generates power dissipation of 9 µW, which is clearly negligible for an input power of 1 W or more. Amorphous silicon easily meets the temperature and vacuum compatibility requirements as well due to its high temperature and high vacuum compatibility.

Figure 3:
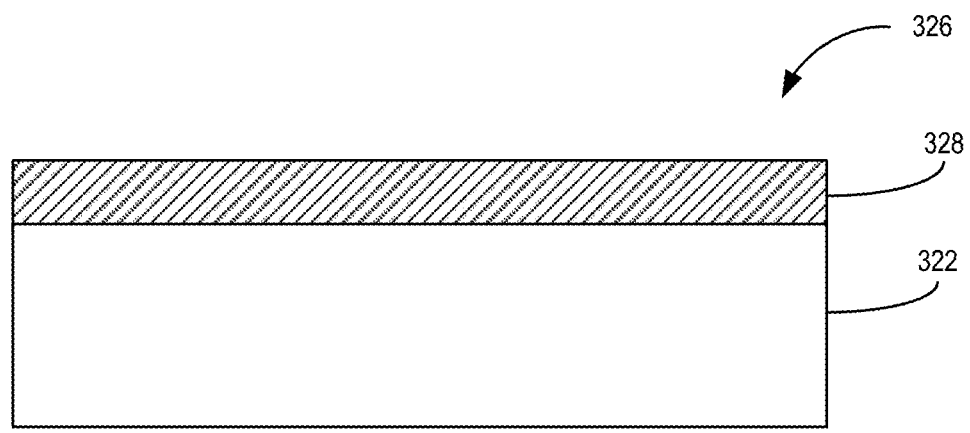
FIG. 3 is an example illustration of a sidewall of an RF cavity in accordance with an embodiment of the present disclosure.

FIG. 3 is an example illustration of a sidewall 326 in accordance with an embodiment of the present disclosure. The illustrated sidewall 326 is one example of the sidewall 226 of RF cavity 206. The sidewall 226 includes insert 322 and coating layer 328. The coating layer 328 may have a thickness dependent upon a skin depth of the material based on working parameters of an RF cavity. For example, the thickness may be 100 to 500 nm, but should be thick enough to provide a continuous layer on the sidewall 326 of the insert 322.

The embodiments discussed herein to illustrate the disclosed techniques should not be considered limiting and only provide examples of implementation. Those skilled in the art will understand the other myriad ways of how the disclosed techniques may be implemented, which are contemplated herein and are within the bounds of the disclosure.

Disclosed herein is a radio frequency (RF) cavity comprising a dielectric insert, the dielectric insert having an opening extending from one side of the dielectric insert to another to form a via, and a coating layer disposed on an inner surface of the dielectric insert, the inner surface facing the via, wherein the coating layer has a thickness and a resistivity, the thickness less than a thickness threshold, and the resistivity greater than a resistivity threshold, wherein the thickness and resistivity thresholds are based partly on operating parameters of the RF cavity.

The example RF cavity of above where the thickness threshold is less than a skin depth of the coating layer, the skin depth based on a resistivity of the material of the coating layer and the operating parameters.

The example RF cavity of above where the thickness does not affect a resonance of the RF cavity.

The example RF cavity of of above where the resistivity threshold is based on a percentage of input power.

The example RF cavity of above where a power dissipation based on the resistivity is equal to or less than ten percent of the input power provided to the RF cavity.

The example RF cavity of above where the material is amorphous silicon.

The example RF cavity of above further including an outer shell, the outer shell including a via extending all the way through and aligned with the via of the insert.

Also disclosed herein is an example apparatus comprising an outer shell, the outer shell having an internal cavity with openings on a top and bottom of the internal cavity, an insert disposed within the internal cavity of the outer shell, the insert having a via extending all the way through and aligned with the openings on the top and bottom of the outer shell, and a coating layer disposed on a surface of the insert facing the via, the coating layer having a thickness less than a thickness threshold and a conductance less than a conductance threshold, wherein the coating layer prevents charge buildup on the insert.

The example apparatus of above where the thickness threshold is less than a skin depth of the coating layer, the skin depth based on one or more material properties of a material forming the coating layer, and on operating parameters of the apparatus.

The example apparatus of above where the thickness threshold is determined so that a radio frequency (RF) resonance of the outer shell is not impacted.

The example apparatus of above where the conductance threshold is based on a percentage of input power and the thickness of the coating layer.

The example apparatus of above where a power dissipation of the coating layer is less than ten percent of input power.

The example apparatus of above where the coating layer is amorphous silicon.

The example apparatus of above where the coating layer is 100 to 500 nm thick and has a conductance less than $1.6 \times 10^{-3} \Omega^{-1} \text{m}^{-1}$.

Also disclosed herein is an example system comprising an emitter coupled to emit a beam of electrons along an optical path, one or more sets of optics arranged along the optical path, and an RF cavity encompassing a portion of the optical path. The RF cavity comprising a dielectric insert, the dielectric insert having an opening extending from one side of the dielectric insert to another to form a via; and a coating layer disposed on an inner surface of the dielectric insert, the inner surface facing the via, wherein the coating layer has a thickness and a resistivity, the thickness less than a thickness threshold, and the resistivity greater than a resistivity threshold, wherein the thickness and resistivity thresholds are based partly on operating parameters of the RF cavity.

The example system of above where the thickness threshold is less than a skin depth of the coating layer, the skin depth based on a resistivity of the material of the coating layer and the operating parameters.

The example system of above where the resistivity threshold is based on a percentage of input power.

The example system of above where a power dissipation based on the resistivity is equal to or less than ten percent of the input power provided to the RF cavity.

The example system of above where the material is amorphous silicon.

The example system of above further including an outer shell, the outer shell including a via extending all the way through and aligned with the via of the insert.

What is claimed is:

1. A radio frequency (RF) cavity comprising:
    a dielectric insert, the dielectric insert having an opening extending from one side of the dielectric insert to another to form a via; and
    a coating layer disposed on an inner surface of the dielectric insert, the inner surface facing the via, wherein the coating layer is amorphous silicon.

2. The RF cavity of claim 1, wherein a thickness of the coating layer is less than a skin depth at an RF operating frequency of 3 GHz.

3. The RF cavity of claim 2, wherein the thickness of the coating layer is less than 0.65 microns.

4. The RF cavity of claim 1, wherein the thickness of the coating layer is 500 nanometers.

5. The RF cavity of claim 1, further including an outer shell, the outer shell including a via extending all the way through and aligned with the via of the insert.

6. An apparatus comprising:
    an outer shell, the outer shell having an internal cavity with openings on a top and bottom of the internal cavity;
    an insert disposed within the internal cavity of the outer shell, the insert having a via extending all the way through and aligned with the openings on the top and bottom of the outer shell; and
    a coating layer disposed on a surface of the insert facing the via, the coating layer being formed of amorphous silicon, wherein the coating layer prevents charge buildup on the insert.

7. The apparatus of claim 6, wherein the thickness threshold is less than a skin depth of the coating layer, the skin depth based on one or more material properties of the coating layer, and on operating parameters of the apparatus being 3 GHz.

8. The apparatus of claim 7, wherein the thickness of the coating layer is less than 0.65 microns.

9. The apparatus of claim 6, wherein the a thickness of the coating later is 500 nanometers.

10. The apparatus of claim 6, wherein the coating layer is 100 to 500 nm thick and has a conductance less than $1.6 \times 10^{-3} \Omega^{-1} \text{m}^{-1}$.

11. A system comprising:
    an emitter coupled to emit a beam of electrons along an optical path;
    one or more sets of optics arranged along the optical path; and
    an RF cavity encompassing a portion of the optical path, the RF cavity comprising:
    a dielectric insert, the dielectric insert having an opening extending from one side of the dielectric insert to another to form a via; and
    a coating layer disposed on an inner surface of the dielectric insert, the inner surface facing the via, wherein the coating layer is formed of amorphous silicon.

12. The system of claim 11, wherein the thickness of the coating layer is less than a skin depth of the coating layer, the skin depth based on a resistivity of the material of the coating layer and the operating parameters.

13. The system of claim 11, further including an outer shell, the outer shell including a via extending all the way through and aligned with the via of the insert.

* * * * *